(12) United States Patent
Ghosh et al.

(10) Patent No.: US 9,355,743 B2
(45) Date of Patent: May 31, 2016

(54) MEMORY ARRAY TEST LOGIC

(71) Applicant: Advanced Micro Devices Inc., Sunnyvale, CA (US)

(72) Inventors: Amlan Ghosh, Austin, TX (US); Keith Allen Kasprak, Austin, TX (US); John Wuu, Fort Collins, CO (US); John Reginald Riley, III, Spicewood, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 23 days.

(21) Appl. No.: 14/266,039

(22) Filed: Apr. 30, 2014

(65) Prior Publication Data

US 2015/0318056 A1 Nov. 5, 2015

(51) Int. Cl.
*G11C 29/02* (2006.01)
*G11C 11/419* (2006.01)

(52) U.S. Cl.
CPC .............. *G11C 29/02* (2013.01); *G11C 11/419* (2013.01)

(58) Field of Classification Search
CPC ..... G11C 29/02; G11C 11/419; G11C 11/413; G11C 7/22
See application file for complete search history.

(56) References Cited

U.S. PATENT DOCUMENTS

| | | | |
|---|---|---|---|
| 6,452,459 B1* | 9/2002 | Chan | G11C 29/028 324/617 |
| 7,545,690 B2* | 6/2009 | Kuang | G11C 29/50 365/154 |
| 2004/0061561 A1* | 4/2004 | Monzel | G11C 29/50 331/57 |
| 2009/0027945 A1* | 1/2009 | Adams | G11C 11/413 365/154 |

* cited by examiner

*Primary Examiner* — Douglas King

(57) ABSTRACT

A test circuit for a static random access memory (SRAM) array includes a plurality of stages coupled in a ring. Each stage includes a plurality of bit cells to store information, a bit line and a complementary bit line coupled to the plurality of bit cells, and a plurality of word lines coupled to the plurality of bit cells. Subsets of the plurality of word lines of each of the plurality of stages are selectively enabled based on signals asserted on the complementary bit line of another one of the plurality of stages. The test circuit also includes inversion logic deployed between two of the plurality of stages.

13 Claims, 7 Drawing Sheets

MEMORY ARRAY TEST LOGIC

BACKGROUND

1. Field of the Disclosure

The present disclosure relates generally to static random access memory (SRAM) arrays and, more particularly, to test structures for characterizing SRAM arrays.

2. Description of the Related Art

A two-step process is used to read information in a bit cell of a conventional static random access memory (SRAM) array: (1) the bit line (BL) and the complementary bit line ($\overline{BL}$) are both pre-charged to a logical high value indicated by "1" and (2) the BL or the $\overline{BL}$ discharges in response to activating the corresponding word line WL so that BL represents the logical value stored in the bit cell and $\overline{BL}$ represents the inverse of the logical value stored in the bit cell. Current generated during step (1) is referred to as a "pre-charge current" and current generated during step (2) is referred to as a "read current." Portions of the SRAM array may fail during read operations due to, for example, process variations during fabrication of the SRAM array, degradation or aging of the SRAM array, and the like. Read failures may be caused by soft oxide breakdown, negative bias temperature instabilities, positive bias temperature instabilities, or hot carrier injection effects. Read failures may also be caused by variations in the pre-charge current or the read current, which may be a function of the device drive strength of pass-gates or pull-down transistors in the bit cell. Test structures may therefore be included in the SRAM to mimic the SRAM array and attempt to predict read or write failure mechanisms in the SRAM array. However, conventional test structures do not decouple the contribution of the pre-charge current and the read current to the read failures.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

The read current can be measured separately from the precharge current using a ring oscillator that includes a plurality of stages formed of a plurality of SRAM bit cells. A bit line (BL) and a complementary bit line ($\overline{BL}$) are used to write, precharge, and read each SRAM bit cell and a word line WL is used to activate transistors that couple the SRAM bit cell to BL and $\overline{BL}$. Multiplexers are deployed between the stages. Subsets of the WLs can be turned on to read the state of a corresponding subset of the bit cells in a stage and turned off to precharge the bit cells in the stage. During a read operation, multiplexers receive a $\overline{BL}$ signal produced by the subset of bit cells associated with the subset of the WLs in each stage and provide signals that activate the subset of the WLs of the next stage in response to the $\overline{BL}$ signal. The multiplexer signals from the last stage in the ring oscillator are inverted and provided to the first stage to initiate a precharge operation in the first stage, which cascades through the stages of the ring oscillator. The stages of the ring oscillator therefore oscillate between a precharge state and a read state. If a sufficiently large pre-charging device is used, the time and precharge current required to precharge the bit cells in each stage is substantially independent of the number of bit cells connected to the selected subset of the WLs of each stage. In contrast, the read current increases substantially in proportion to the number of selected subset of the WLs of each stage, which leads to a shorter discharge time for larger numbers of bit cells and a higher ring oscillator frequency. The read current can therefore be determined independently of the precharge current by comparing ring oscillator frequencies for different sizes of the selected subset of the WLs.

Figure 1:
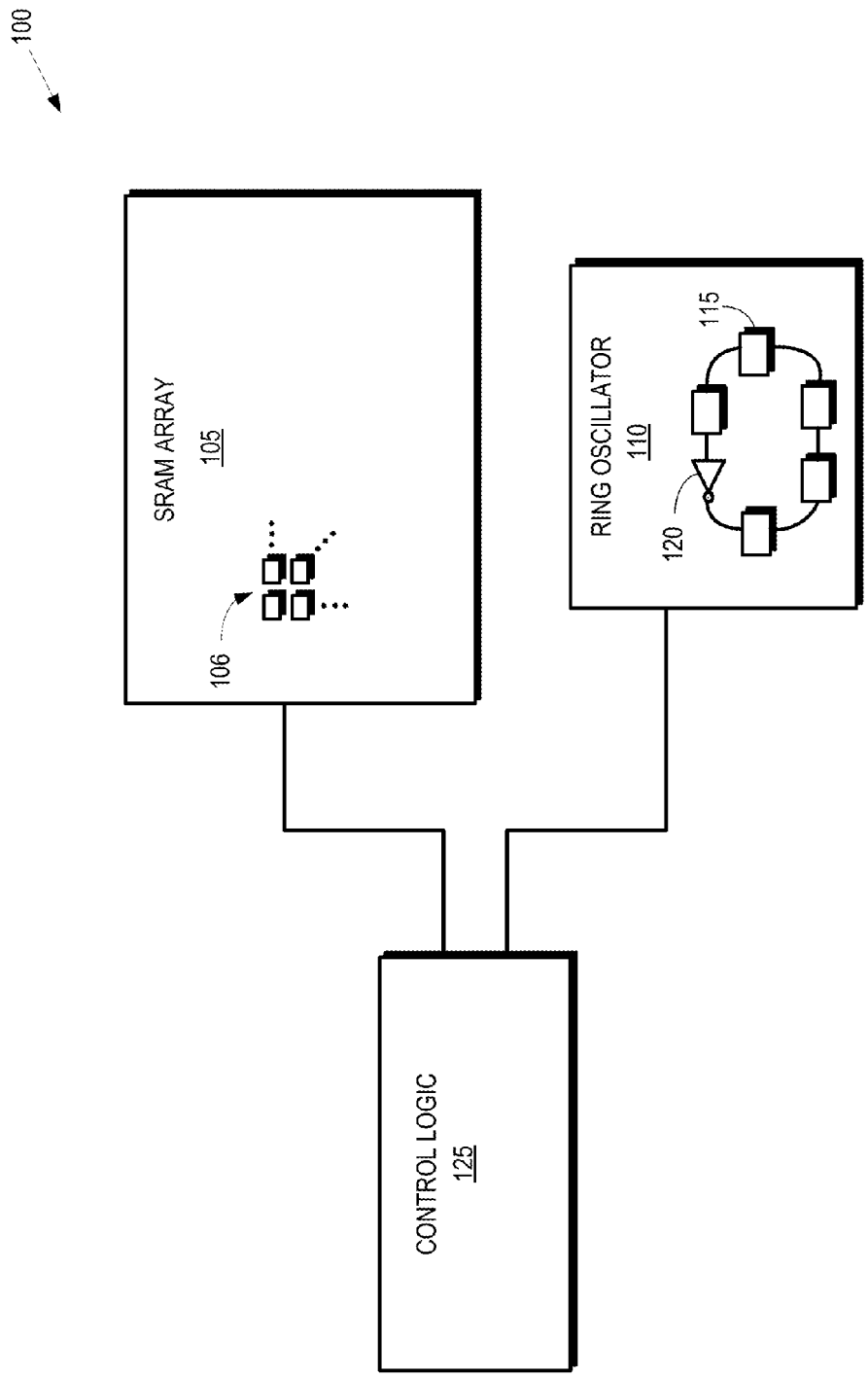
FIG. 1 is a block diagram of a memory device according to some embodiments.

FIG. 1 is a block diagram of a memory device 100 according to some embodiments. The memory device 100 includes a static random access memory (SRAM) array 105 that includes a plurality of bit cells (not shown) arranged in one or more bit lines. The number of bit cells or bit lines in the SRAM array 105 are matters of design choice. Information may be stored in the SRAM array 105 by "writing" data to one or more of the plurality of bit cells 106 to place the bit cells 106 into a logic-high or a logic-low state. Information can be read from the bit cells 106 of the SRAM array 105 using bit lines, complementary bit lines, and word lines that are coupled to the bit cells 106 in the bit lines of the SRAM array 105. A two-step process is used to read information from the SRAM array 105: (1) a bit line (BL) and a complementary bit line ($\overline{BL}$) associated with a bit cell 106 in the SRAM array 105 are both pre-charged to a logical high value indicated by "1" and (2) the BL or the $\overline{BL}$ discharges in response to turning on the corresponding word line WL so that BL represents the logical value stored in the bit cell 106 and $\overline{BL}$ represents the inverse of the logical value stored in the bit cell 106.

The memory device 100 also includes a ring oscillator 110 that includes a plurality of stages 115 (only one indicated by a reference numeral in the interest of clarity) that are coupled in a ring configuration. Each stage 115 includes a plurality of bit cells (not shown) that can be used to store a logical high value or logical low value, which can be subsequently read. The "precharge current" of the ring oscillator 110 is defined as the current provided by a pre-charging device (not shown) to precharge the bit lines and complementary bit lines of the bit cells in the stages 115. The "read current" of the ring oscillator 110 is defined as the current generated by the bit cells in the stages 115 as the pre-charged bit lines or complementary bit lines discharge to settle into their steady-state.

Some embodiments of the stages 115 include bit cells that are substantially the same as the bit cells 106 used to form the SRAM array 105. As used herein, the phrase "substantially the same" indicates that the properties or characteristics of the bit cells in the stages 115 are within a selected tolerance or degree of variation of the properties or characteristics of the bit cells 106 in the SRAM array 105. For example, the bit cells in the stages 115 and the SRAM array 105 may be formed using the same process recipe and may even be formed concurrently using the same process in the same fabrication device. Thus, the measured properties or characteristics of the bit cells in the stages 115 may be indicative of the properties or characteristics of the bit cells 106 in the SRAM array 105. For example, the read current of the ring oscillator 110 may be used to estimate or characterize the read current of the corresponding SRAM array 105.

Inversion logic 120 is coupled between two of the stages 115. As discussed in detail herein, the stages 115 are interconnected so that signals on the complementary bit lines of each stage 115 drive corresponding signals onto a subset of the word lines of the next stage 115 in the ring oscillator 110. The combination of the inversion logic 120 and delays due to pre-charging the stages 115 and reading the stages 115 cause the ring oscillator 110 to oscillate between a pre-charging state in which the bit lines and complementary bit lines of each stage 115 are being pre-charged and a read state in which the bit lines or complementary bit lines of each stage 115 are discharging to settle into a steady state that represents the internal state of the bit cell. The high duty cycle of the oscillation is determined by the read time of the stages 115 and the low duty cycle of the oscillation is determined by the precharge time of the stages 115.

In one embodiment, the time required for the stages 115 of the ring oscillator 110 to complete one oscillation of the precharge state and the read state, which is referred to herein as the cycle time ($t_{cycle}$), may be estimated as:

$$t_{cycle} = N_s \times (t_{read} + t_{pc} + t_{delay}).$$

The read time $t_{read}$ for the bit cells in each column or bit line of the $N_s$ stages is:

$$t_{read} = \frac{C_{bl} \cdot V_{DD}}{N_{wl} \cdot I_{read}}, \qquad (1)$$

where $C_{bl}$ is the capacitance of a bit line, $V_{DD}$ is the voltage supplied to the memory device 100, $N_{wl}$ is the number of word lines that are enabled, and $I_{read}$ is the read current. The precharge time $t_{pc}$ for each column or bit line is:

$$t_{pc} = \frac{C_{bl} \cdot V_{DD}}{I_{ds}},$$

where $I_{ds}$ is the source-drain saturation current for the precharging device. The delay time $t_{delay}$ represents any additional delay in the logic used to form the ring oscillator 110 or other portions of the memory device 100.

Control logic 125 is coupled to the SRAM array 105 and the ring oscillator 110. The control logic 125 may be implemented as an integrated portion of the memory device 100 or as a separate device. The control logic 125 may be used to determine the read current for the stages 115 of the ring oscillator 110 separately from the precharge current for the stages 115 by enabling different subsets of the word lines for the stages 115 and then measuring the oscillation frequencies of the ring oscillator 110 corresponding to the different subsets. For example, the control logic 125 may enable a first portion or subset ($N_{wl,1}$) of the word lines in the stages 115 of the ring oscillator 110 and then measure the oscillation frequency $$f_1 = \frac{1}{t_{cycle,1}}$$

or me ring oscillator 110. The control logic 125 may enable a second portion or subset ($N_{wl,2}$) of the word lines in the stages 115 of the ring oscillator 110 and then measure the oscillation frequency $$f_2 = \frac{1}{t_{cycle,2}}$$

of the ring oscillator 110. Assuming that the precharge time remains the same (which is equivalent to assuming a sufficiently large precharge device), the read current $I_{read}$ may then be estimated as:

$$\frac{1}{f_1} - \frac{1}{f_2} = N_s \times (t_{read,1} - t_{read,2}), \qquad (2)$$

or, by substituting eq. (1) into eq. (2):

$$I_{read} = \frac{N_s \cdot C_{bl} \cdot V_{DD} \cdot \left(\frac{1}{N_{wl,1}} - \frac{1}{N_{wl,2}}\right)}{\left(\frac{1}{f_1} - \frac{1}{f_2}\right)}. \qquad (3)$$

Some embodiments of the control logic 125 may generalize equation (3) to account for smaller precharge devices, which may introduce a dependence of the read current on the precharge time $t_{pc}$.

Figure 2:
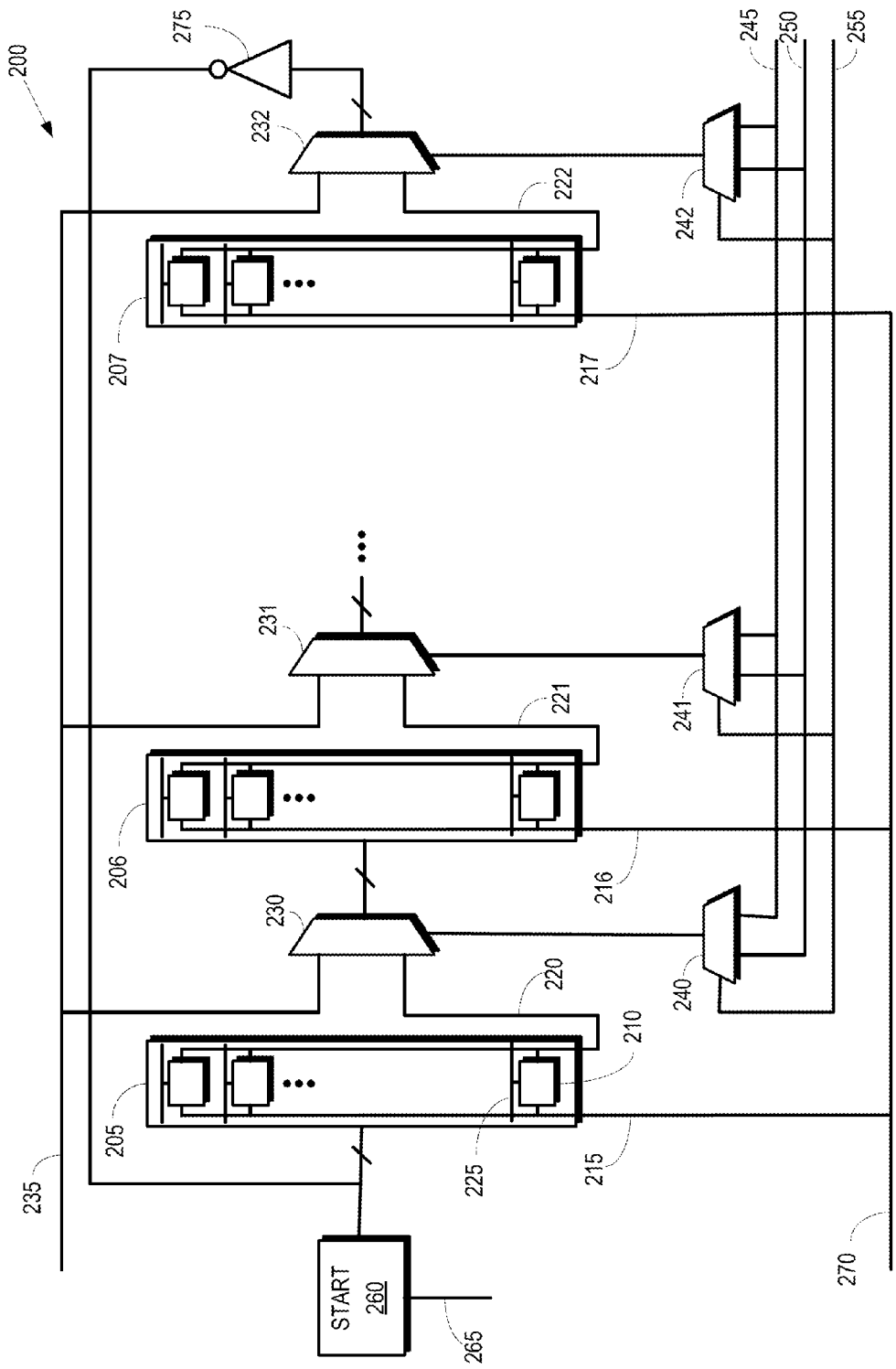
FIG. 2 is a block diagram of a ring oscillator according to some embodiments.

FIG. 2 is a block diagram of a ring oscillator 200 according to some embodiments. The ring oscillator 200 may be implemented as the ring oscillator 110 shown in FIG. 1. The ring oscillator 200 includes stages 205, 206, 207 (referred to collectively as "the stages 205-207") that each include a plurality of bit cells 210 (only one indicated by a reference numeral in the interest of clarity). The number of stages 205-207 and bit cells 210 are matters of design choice. The bit cells 210 in the stages 205-207 are coupled to corresponding bit lines 215, 216, 217 (referred to collectively as "the bit lines 215-217") and complementary bit lines 220, 221, 222 (referred to collectively as "the complementary bit lines 220-222"). Each bit cell 210 is also coupled to a corresponding word line 225 (only one indicated by a reference numeral in the interest of clarity).

Multiplexers 230, 231, 232 (referred to collectively as "the multiplexers 230-232") are deployed between the stages 205-207. The multiplexers 230-232 receive input signals that are generated in response to signals asserted on the complementary bit lines 220-222 and input signals received at the nodes 235. The signals asserted at the nodes 235 may be used to enable writing of the bit cells 210, as discussed herein. The multiplexers 230-232 receive selection signals from corresponding multiplexers 240, 241, 242 (referred to collectively as "the multiplexers 240-242"). The multiplexers 240-242 receive one set of inputs at the nodes 245 to indicate subsets of the word lines 225 and another set of inputs at the nodes 250 that may be used to enable writing of the bit cells 210, as discussed herein. The selection signal asserted at the node 255 for the multiplexers 240-242 is used to select between two modes of operation of the ring oscillator 200: an initialization mode and an oscillation mode.

Start logic 260 may be used to initialize the states of the stages 205-207 in the initialization mode. For example, the start logic 260 may be placed in the initialization mode by asserting a logic-low signal at the node 265. In the initialization mode, a logic-high signal is asserted at the node 255 to select the input 250 to be provided as the selection signal to the multiplexers 230-232 via the multiplexers 240-242. A logic-high signal is also asserted at the node 235 so that all of the word lines 225 receive a logic-high signal that enables writing of the bit cells 210. A logic-high signal is also asserted at the node 270 so that logic-high values are written into the bit cells 210.

Start logic 260 may also be used to trigger oscillation of the states of the stages 205-207 in the oscillation mode. For example, the start logic 260 may be placed in the oscillation mode by asserting a logic-high signal at the node 265. In the oscillation mode, a logic-low signal is asserted at the node 255 to select the node 245 to be provided as the selection signal to the multiplexers 230-232 via the multiplexers 240-242. The node 245 provide signals that select a subset of the word lines 225 to enable reading of the bit cells 210 associated with the selected subset of the word lines 225. Upon entering the oscillation mode, states of the stages 205-207 oscillate between a pre-charging state and a reading state. For example, the stage 205 may begin pre-charging so that the bit line 215 and the complementary bit line 220 are being driven to logic-high values by a pre-charging device. The complementary bit line 220 is connected to the word lines 225 via the multiplexer 230. The selected subset of the word lines 225 in the stage 206 are enabled in response to the complementary bit line 220 reaching the logic-high value, which triggers pre-charging of the bit line 216 and the complementary bit line 221. Pre-charging cascades to the stage 207 in this manner until the complementary bit line 222 reaches the logic-high state.

The signal on the complementary bit line 222 is provided to inverter 275 so that a logic-low signal is provided to enable reading of the bit cells 210 associated with the selected subset of the word lines 225 in the stage 205. The bit line 215 or the complementary bit line 220 may then selectively discharge to represent the value in the bit cell 210 and the inverse of the value in the bit cell 210, respectively. Since the bit cells 210 have been initialized to a logic-high value, the complementary bit line 220 discharges to a logic-low level. The logic-low signal on the complementary bit line 220 enables reading of the bit cells 210 associated with the selected subset of the word lines in the stage 206. The complementary bit line 221 discharges to a logic-low level and enables reading in the subsequent stages. Reading cascades to the stage 207 in this manner until the complementary bit line 222 reaches the logic-low state. The inverter 275 inverts this value and provides the inverted signal to initiate pre-charging in the stage 205. Thus, the states of the stages 205-207 oscillate through the precharge/read cycle at a frequency that is determined by the pre-charging time and reading time of the bit cells 210, as discussed herein.

In the illustrated embodiment, the stages 205-207 of the ring oscillator 200 are interconnected by the complementary bit lines 220-222 and the values stored in the bit cells 210 may be initialized using the bit lines 215-217. However, some embodiments may initialize the values stored in the bit cells using the complementary bit lines 220-222 and the stages 205-207 may be interconnected by the bit lines 215-217.

Figure 3:
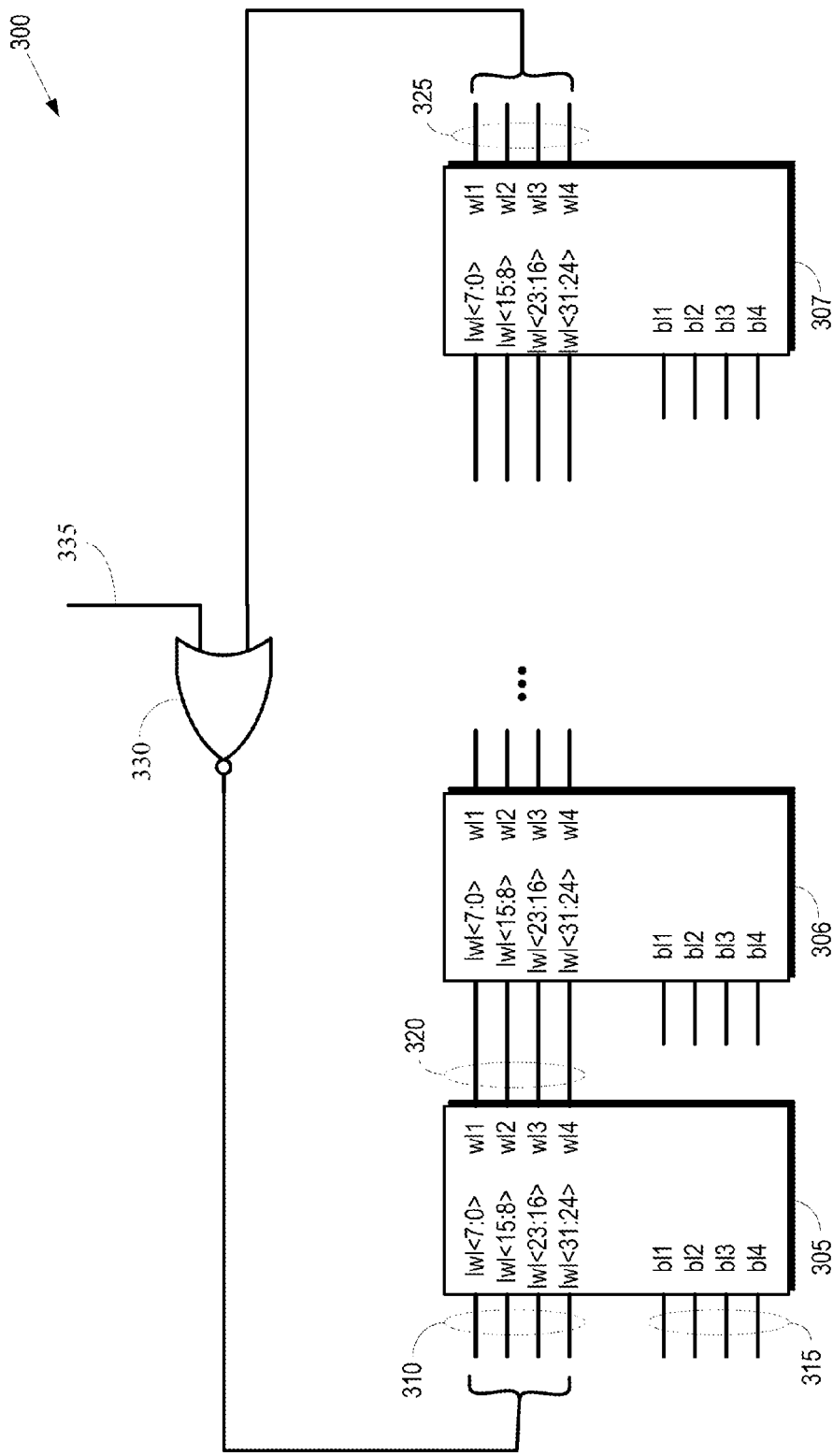
FIG. 3 is a schematic circuit diagram of a ring oscillator according to some embodiments.

FIG. 3 is a schematic circuit diagram of a ring oscillator 300 according to some embodiments. The ring oscillator 300 may be used to implement the ring oscillator 110 shown in FIG. 1. The ring oscillator 300 includes stages 305, 306, 307 (referred to collectively as "the stages 305-307"), which may include a plurality of bit cells and may correspond to the stages 205-207 shown in FIG. 2. Each of the stages 305-307 includes a plurality of nodes 310 that are coupled to word lines in the stage. Some embodiments may group the word lines so that each of the nodes 310 can be used to assert a signal onto each word line in the group. For example, the states 305 includes 32 word lines (iwl<31:0>) that are divided into four groups (iwl<7:0>, iwl<15:8>, iwl<23:16>, iwl<31:24>). Each of the groups is coupled to one of the nodes 310.

Each stage 305-307 also includes a plurality of nodes 315 that can receive signals that are used to select one or more subsets of the word lines in the stage. For example, a logic-high signal asserted at the node bl1 may enable the first group of word lines (iwl<7:0>), a logic-high signal asserted at the node bl2 may enable the second group of word lines iwl<15:8>, a logic-high signal asserted at the node bl3 may enable the third group of word lines iwl<23:16>, and a logic-high signal asserted at the node bl4 may enable the fourth group of word lines iwl<31:24>.

Each stage 305-307 may generate signals at a plurality of nodes 320 that correspond to signals on complementary bit lines (not shown) in the stages 305-307 for enabled subsets of the word lines. For example, a logic-high signal asserted at the node bl1 may enable the first group of word lines (iwl<7:0>) so that the signal asserted at node wl1 corresponds to the value of the complementary bit line, a logic-high signal asserted at the node bl2 may enable the second group of word lines iwl<15:8> so that the signal asserted at node wl2 corresponds to the value of the complementary bit line, a logic-low signal asserted at the node bl3 may disable the third group of word lines iwl<23:16> so that the signal asserted at node wl3 is a logic-low signal, and a logic-low signal asserted at the node bl4 may disable the fourth group of word lines iwl<31:24> so that the signal asserted at node wl4 is a logic-low signal.

Signals at the nodes 325 of the stage 307 are provided to inversion logic 330, which may be enabled by a logic-high signal asserted at the node 335. For example, the inversion logic 330 may perform a NOR operation using the signals asserted at the node 335 and the signals from the nodes 325 of the stage 307. The signals produced by the inversion logic 330 may then be provided to the nodes 310 of the stage 305.

Figure 4:
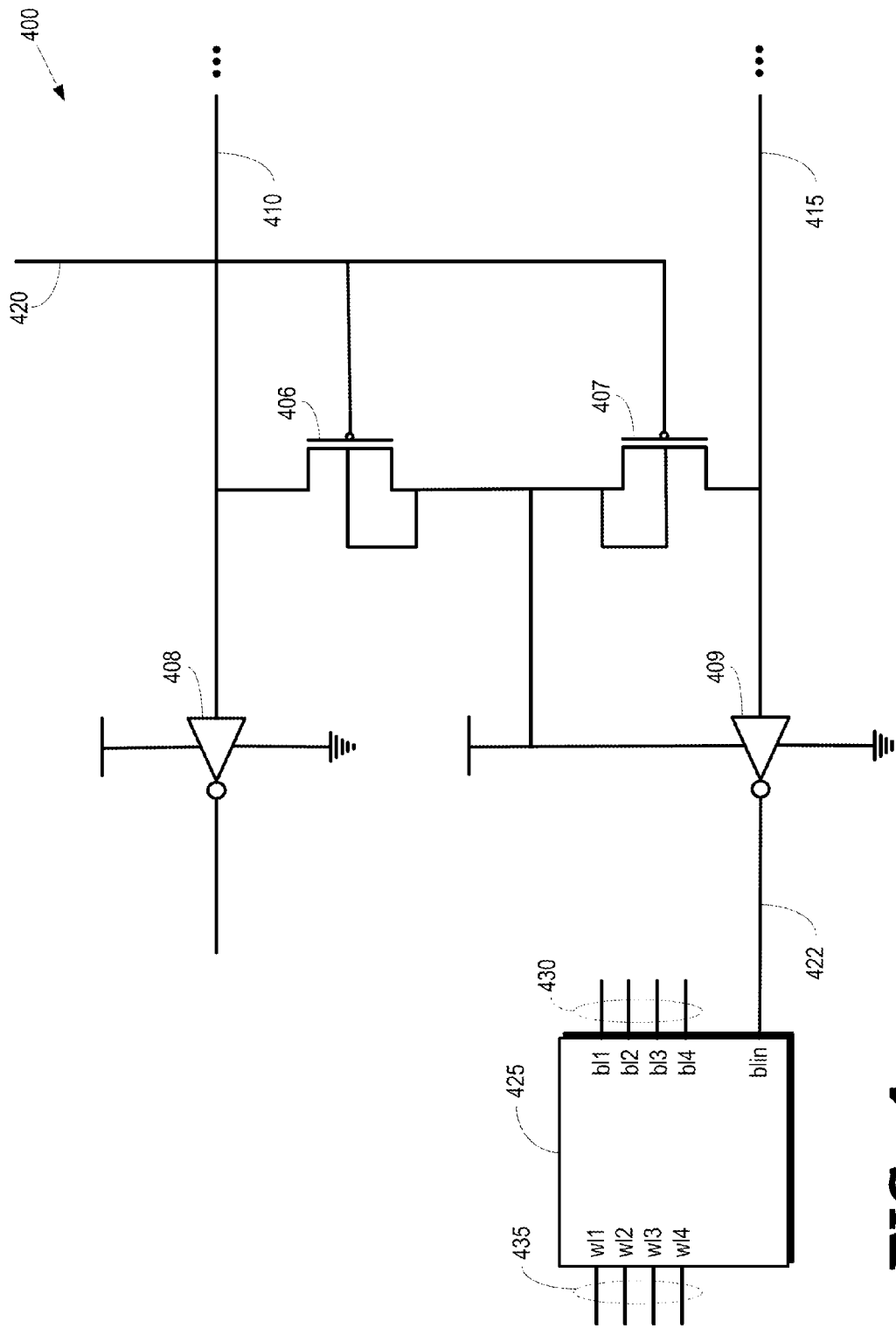
FIG. 4 is a circuit diagram of a portion of a stage of a ring oscillator according to some embodiments.

FIG. 4 is a circuit diagram of a portion 400 of a stage of a ring oscillator according to some embodiments. The portion 400 may be implemented in the stages 205-207 shown in FIG. 2 or the stages 305-307 shown in FIG. 1. The portion 400 includes transistors 406, 407 and inverters 408, 409. The transistors 406, 407 are used to pre-charge a bit line 410 and a complementary bit line 415 based on the signals asserted on the precharge line 420, which may be coupled to a word line. These lines may correspond to the bit lines 215-217, the complementary bit lines 220-222, and the word lines 225 shown in FIG. 2. In some embodiments, when a logic-high signal is asserted on the pre-charge line 420, the precharge devices 406, 407 are turned off and either the bit line 410 or the complementary bit line 415 discharges based on the value stored in the corresponding bit cells, such as the bit cells 210 in the stage 205 shown in FIG. 2. For example, if logic-high values are initially stored in the bit cells, the complementary bit line 415 discharges to a logic-low value when the pre-charge devices 406, 407 are turned off. The signal is inverted by the inverter 409 so that a logic-high signal is asserted on the line 422.

The portion 400 also includes a multiplexer 425 that may correspond to the multiplexers 230-232 shown in FIG. 2. The multiplexer 425 may be an integral part of a stage of a ring oscillator or may be implemented external to the stage. The complementary bit line 415 is coupled to a node blin of the multiplexer 425. The multiplexer 425 is also coupled to nodes 430 that convey signals used to enable subsets of word lines and which may correspond to the nodes 315 shown in FIG. 3. The multiplexer 425 is also coupled to nodes 435 that are coupled to the word line nodes of subsequent stages and which may correspond to the nodes 320 shown in FIG. 3. The multiplexer 425 conveys the signal received at the node blin to a subset of the nodes 435 that are selected by signals asserted at the nodes 430.

Figure 5:
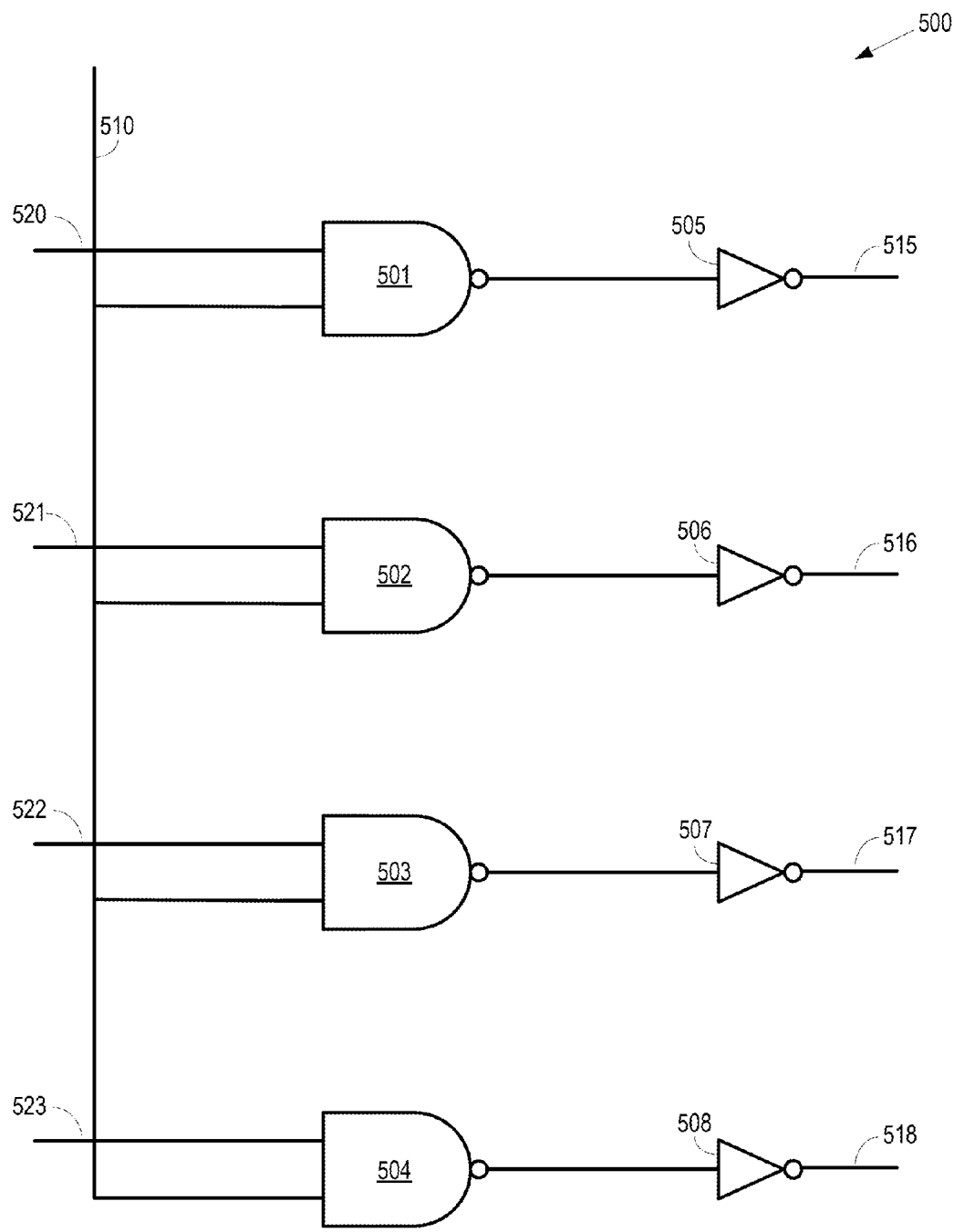
FIG. 5 is a circuit diagram of the multiplexer according to some embodiments.

FIG. 5 is a circuit diagram of the multiplexer 500 according to some embodiments. The multiplexer 500 may be used to implement the multiplexers 230-232 shown in FIG. 2 or the multiplexer 425 shown in FIG. 4. The multiplexer 500 includes NAND gates 501, 502, 503, 504 (referred to collectively as "the NAND gates 501-504") and inverters 505, 506, 507, 508 (referred to collectively as "the inverters 505-508"). The multiplexer 500 receives an input signal asserted at node 510 and selectively provides the input signal to the nodes 515, 516, 517, 518 (referred to collectively as "the nodes 515-518") based on selection signals received at the nodes 520, 521, 522, 523 (referred to collectively as "the nodes 520-523"). For example, if a logic-high signal is asserted at the node 510, a logic-high signal is asserted at the node 520, and logic-low signals are asserted at the nodes 521-523, then a logic-high signal is asserted at the node 515 and logic-low signals are asserted at the nodes 516-518. For another example, if a logic-low signal is asserted at the node 510, a logic-high signal is asserted at the node 520, and logic-low signals are asserted at the nodes 521-523, then a logic-low signal is asserted at the nodes 515-518.

Figure 6:
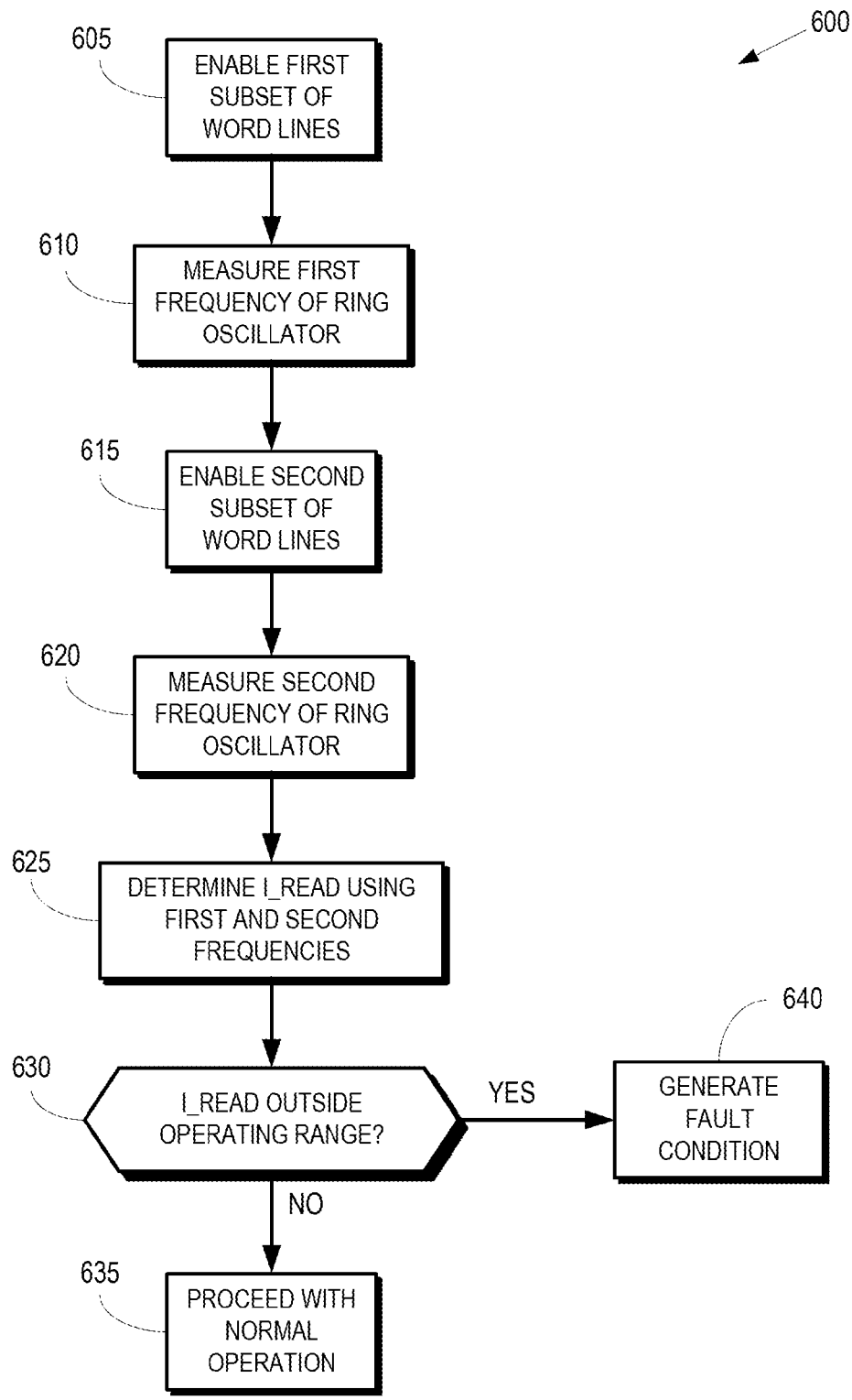
FIG. 6 is a flow diagram of a method for establishing a fault condition based on a read current of a ring oscillator according to some embodiments.

FIG. 6 is a flow diagram of a method 600 for establishing a fault condition based on a read current of a ring oscillator according to some embodiments. The method 600 may be implemented in some embodiments of the control logic 125 shown in FIG. 1. At block 605, the controller enables a first subset of the word lines of the stages of the ring oscillator. The controller may then initialize the states of the bit cells in the stages and initiate oscillation, as discussed herein. At block 610, the controller measures the oscillation frequency of the ring oscillator, e.g. by comparing the states of the ring oscillator to an internal clock. At block 615, the controller enables a second subset of the word lines that is different than the first subset. For example, the controller may enable eight (8) word lines of the stages at block 605 and the controller may enable sixteen (16) word lines of the stages at block 615. At block 620, the controller measures the oscillation frequency of the ring oscillator. Due to the different number of enabled word lines, the oscillation frequencies measured at block 610 and block 620 differ from each other.

At block 625, the controller determines the read current (I_read) for bit cells in the ring oscillator, e.g., using equation (3). At decision block 630, the controller determines whether the read current is inside or outside of a predetermined operating range. For example, the operating range may be defined by a minimum read current and a maximum read current that correspond to normal or acceptable operation of the bit cells. If the read current is not outside the operating range, the controller may proceed with normal operation at block 635. If the read current is outside the operating range, the controller may generate a fault condition at block 640. For example, the ring oscillator may be formed using bit cells that are substantially the same as an associated SRAM array. A fault condition in the read current of the bit cells of the ring oscillator may therefore indicate a corresponding fault condition in the associated SRAM array. The fault condition may therefore be used to detect or correct faults in the associated SRAM array.

In some embodiments, the apparatus and techniques described above are implemented in a system comprising one or more integrated circuit (IC) devices (also referred to as integrated circuit packages or microchips), such as the ring oscillator described above with reference to FIGS. 1-6. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 7:
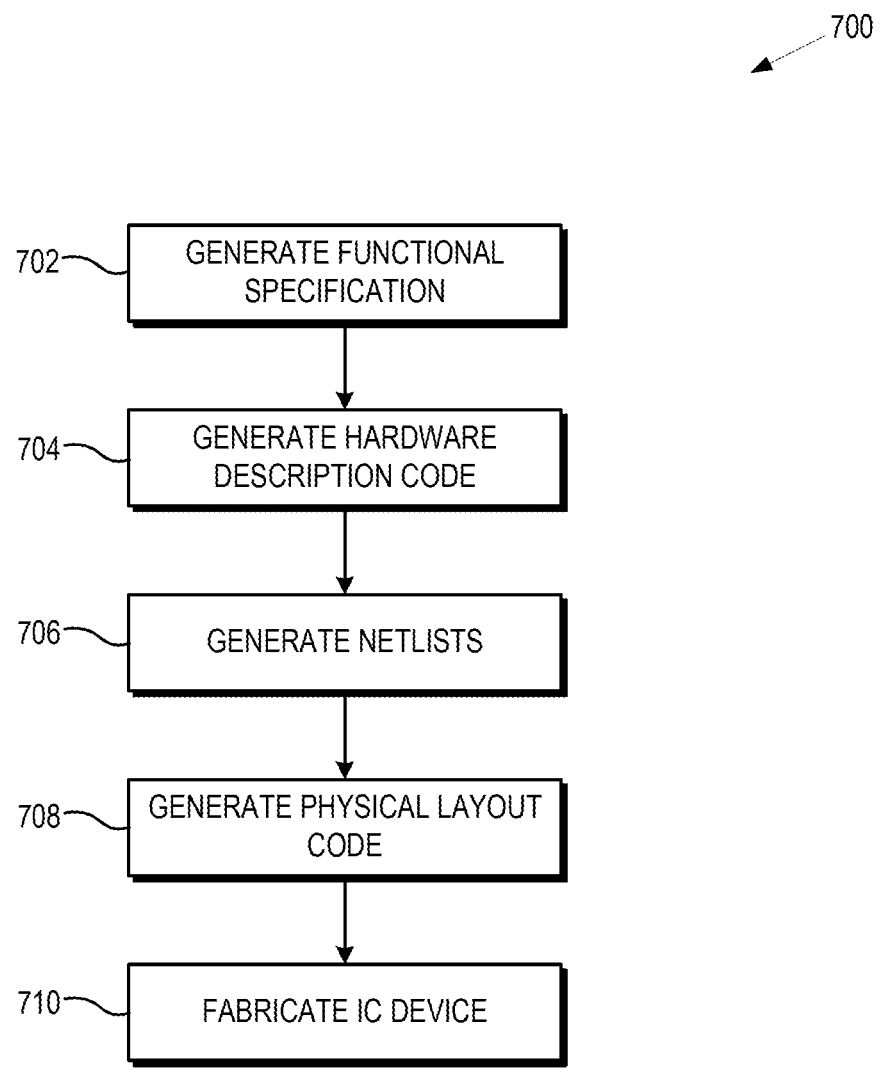
FIG. 7 is a flow diagram illustrating a method for designing and fabricating an integrated circuit device implementing at least a portion of a component of a processing system in accordance with some embodiments.

FIG. 7 is a flow diagram illustrating an example method 700 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 702 a functional specification for the IC device is generated. The functional specification (often referred to as a micro architecture specification (MAS)) may be represented by any of a variety of programming languages or modeling languages, including C, C++, SystemC, Simulink, or MATLAB.

At block 704, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, System-Verilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 706 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 708, one or more EDA tools use the netlists produced at block 706 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 710, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus comprising:
   a plurality of stages coupled in a ring, each stage comprising:
   a plurality of bit cells to store information;
   a bit line and a complementary bit line coupled to the plurality of bit cells; and
   a plurality of word lines coupled to the plurality of bit cells, wherein subsets of the plurality of word lines of each of the plurality of stages are selectively enabled based on signals asserted on at least one of the bit line and the complementary bit line of another one of the plurality of stages; and
   inversion logic deployed between two of the plurality of stages; and
   control logic to determine a read current for the plurality of stages based on oscillation frequencies produced by different subsets of the plurality of word lines of each of the plurality of stages.

2. The apparatus of claim 1, further comprising:
   a plurality of multiplexers, wherein each multiplexer is coupled between a pair of the plurality of stages to selectively provide signals that enable the subsets of the plurality of word lines of one of the pair of the plurality of stages based on signals asserted on at least one of the bit line and the complementary bit line of another one of the plurality of stages.

3. The apparatus of claim 1, further comprising:
start logic to initialize the plurality of bit cells in the plurality of stages to a first logic state and trigger oscillation of states of the plurality of stages by selectively asserting a signal to at least one node of a first one of the plurality of stages corresponding to the at least one of the subsets of the plurality of word lines.

4. The apparatus of claim 1, wherein the control logic is to select a first subset of the plurality of word lines and determine a first oscillation frequency produced by providing an enable signal to the first subset of the plurality of word lines, select a second subset of the plurality of word lines and determine a second oscillation frequency produced by providing the enable signal to the second subset of the plurality of word lines, and determine the read current based on the first and second oscillation frequencies.

5. The apparatus of claim 2, wherein the control logic is to provide a selection signal to each of the plurality of multiplexers to select the different subsets of the plurality of word lines.

6. The apparatus of claim 1, wherein the control logic is to generate a fault condition based on the oscillation frequencies produced by the different subsets of the plurality of word lines being outside a predetermined operating range.

7. The apparatus of claim 1, further comprising:
a static random access memory (SRAM) array comprising a plurality of bit cells, wherein the plurality of bit cells in the plurality of stages are representative of the plurality of bit cells in the SRAM array.

8. A non-transitory computer readable medium embodying a set of executable instructions, the set of executable instructions to manipulate a computer system to perform a process to fabricate an integrated circuit (IC) device, the IC device comprising:
a plurality of stages coupled in a ring, each stage comprising:
a plurality of bit cells to store information;
a bit line and a complementary bit line coupled to the plurality of bit cells; and
a plurality of word lines coupled to the plurality of bit cells, wherein subsets of the plurality of word lines of each of the plurality of stages are selectively enabled based on signals asserted on at least one of the bit line and the complementary bit line of another one of the plurality of stages; and
inversion logic deployed between two of the plurality of stages; and
control logic to determine a read current for the plurality of stages based on oscillation frequencies produced by different subsets of the plurality of word lines of each of the plurality of stages.

9. The non-transitory computer readable medium of claim 8, wherein the set of executable instructions is to manipulate the computer system to perform a portion of a process to fabricate the IC device comprising:
a plurality of multiplexers, wherein each multiplexer is coupled between a pair of the plurality of stages to selectively provide enable signals for the subsets of the plurality of word lines of one of the pair of the plurality of stages based on signals asserted on the complementary bit line of another one of the plurality of stages.

10. The non-transitory computer readable medium of claim 8, wherein the set of executable instructions is to manipulate the computer system to perform a portion of a process to fabricate the IC device comprising:
start logic to initialize the plurality of bit cells in the plurality of stages to a logic-high state and trigger oscillation of states of the plurality of stages by selectively asserting a logic-high signal to at least one node of a first one of the plurality of stages corresponding to the at least one of the plurality of subsets of the plurality of word lines.

11. The non-transitory computer readable medium of claim 8, wherein the set of executable instructions is to manipulate the computer system to perform a portion of a process to fabricate the IC device comprising:
control logic to select a first subset of the plurality of word lines and determine a first oscillation frequency produced by providing an enable signal to the first subset of the plurality of word lines, select a second subset of the plurality of word lines and determine a second oscillation frequency produced by providing the enable signal to the second subset of the plurality of word lines, and determine the read current based on the first and second oscillation frequencies.

12. The non-transitory computer readable medium of claim 8, wherein the set of executable instructions is to manipulate the computer system to perform a portion of a process to fabricate the IC device comprising:
control logic to generate a fault condition in response to the read current being outside a predetermined operating range.

13. The non-transitory computer readable medium of claim 8, wherein the set of executable instructions is to manipulate the computer system to perform a portion of a process to fabricate the IC device comprising:
a static random access memory (SRAM) array comprising a plurality of bit cells, wherein the plurality of bit cells in the plurality of stages are representative of the plurality of bit cells in the SRAM array.

* * * * *